United States Patent [19]
Fukuhara et al.

[11] Patent Number: 6,038,191
[45] Date of Patent: Mar. 14, 2000

[54] CIRCUIT FOR REDUCING STAND-BY CURRENT INDUCED BY DEFECTS IN MEMORY ARRAY

[75] Inventors: Hideyuki Fukuhara, Ami-machi; Hiroya Nakamura, Tsukuba; Takumi Nasu, Tsuchiura, all of Japan

[73] Assignee: Texas Instruments Incorporated, Dallas, Tex.

[21] Appl. No.: 09/110,036

[22] Filed: Jul. 2, 1998

Related U.S. Application Data

[60] Provisional application No. 60/064,835, Oct. 22, 1997.
[51] Int. Cl.[7] .................................................. G11C 7/00
[52] U.S. Cl. ........................................ 365/229; 365/200
[58] Field of Search .................................. 365/229, 200, 365/149, 210, 225.7, 230.06

[56] References Cited

U.S. PATENT DOCUMENTS 5,956,275  9/1999  Duesman .............................. 365/200
5,959,907  9/1999  Kim et al. ............................ 365/200

*Primary Examiner*—Son T. Dinh
*Attorney, Agent, or Firm*—Robby T. Holland; Carlton H. Hoel; Richard L. Donaldson

[57] ABSTRACT

A circuit for reducing the stand-by current of semiconductor device is disclosed in a number of embodiments. In a first embodiment, a first conductive line (302), such as a bit line or common capacitor plate in a DRAM, is charged to a first potential in a stand-by state. A second conductive line (304), such as a word line in a DRAM, is driven to the first potential in the stand-by state in the event a short circuit condition exists between the first conductive line (302) and the second conductive line (304). In a second embodiment, a second conductive line (404) in a semiconductor device is 34w isolated from other circuits in the semiconductor device in a stand-by mode. This allows the second conductive line (404) to rise to a short circuit potential in the event a short circuit condition exists between the second conductive line (404) and a short circuit potential.

76 Claims, 8 Drawing Sheets

US 6,038,191

CIRCUIT FOR REDUCING STAND-BY CURRENT INDUCED BY DEFECTS IN MEMORY ARRAY

This is a Non Provisional application filed under 35 USC 119(e) and claims priority of prior provisional, Ser. No. 60/064,835 of inventor Fukuhara, et al, filed Oct. 22, 1997.

TECHNICAL FIELD

The present invention relates generally to semiconductor devices, and more particularly to circuits for reducing the power consumption of semiconductor devices.

BACKGROUND OF THE INVENTION

Power supply requirements play an increasingly important role in the design of integrated circuits (ICs). For example, for electronic devices that operate on limited power supplies, such as batteries, the amount of power consumed by the ICs plays a direct role on the amount of time the electronic device can operate before requiring new and/or recharged batteries. The amount of power consumed by an IC is related to the square of the current running through the IC (i.e., P=IV, where V is equal to IR). Thus, when the current is reduced the power is reduced. In addition, some power supplies may be limited by the manner in which they deliver power. For example, while power supplies for electronic devices typically provide power at one voltage, such supplies may have a limited current capability. ICs that require less current provide more flexibility when such current limited supplies are used.

The power consumption of an IC can be reduced by using different device technologies. For example, ICs manufactured with bipolar transistors, while providing rapid switching speeds, have relatively high current requirements. Metal-oxide (insulator)-semiconductor (MOS) transistors can require less power, and in the event complementary MOS (CMOS) technology is employed, substantial power savings can occur. The manner in which CMOS logic devices switch, results in relatively small amounts of current being drawn, and hence consumes less power.

The rate at which an IC draws current also depends upon the operational status of the device (i.e., what function the IC is performing). An IC may be in an "active" state, in which the IC is performing some operation in response to an external signal, or an IC may be in a "stand-by state," in which power is applied to the IC, but the IC is performing minimal functions, or no functions at all. In the active state, an IC will typically draw more current, as its internal devices, such as transistors and the like, are switching between states to arrive at an output signal. Thus, more power is required in the active state. In contrast, IC power consumption can be considerably lower in the stand-by state as few, if any devices are switching between states. Because, in many applications, an IC is in the stand-by state more often than the active state, it is desirable to have the IC draw as little current as possible when in the stand-by state (have a low stand-by current).

Just one example of an IC having an active and stand-by state can be given by the read operation of a random access memory (RAM). Before the read operation, the RAM is in a stand-by state. In response to input signals, such as an address (and/or clock) signal, the RAM enters an active state, and the various internal circuits respond to the input signal by accessing a given memory location and providing the data stored at the location.

The power consumption of an IC can also be reduced by circuit design. The manner in which internal devices switch in relationship to one another can reduce the amount of current required by the IC.

Unfortunately, despite careful selection of device technology and mindful circuit design, there are many uncontrollable factors that result in poor power performance. Among these factors are manufacturing defects created during the fabrication of the IC. Highly integrated semiconductor devices include multiple conductive lines that run over and adjacent to one another, and are separated by insulating layers that can have a thickness in the hundreds of angstroms ($\sim 500 \times 10^{-10}$ m). Thus, a defect in the order of a hundred thousandth of a centimeter can effect the operation of the IC. Defects can arise from any of a number sources: very small particles, variation in starting materials, or lack of precision in a process step—such as an etching step, to name just a few.

Defects arising from manufacturing can be overcome by "repairing" an IC by using redundant circuits. A redundant circuit provides identical functionality to "standard" circuits in an IC. In the event a standard circuit is defective, it can be disabled, and replaced by a redundant circuit. While redundancy can repair an IC so that it is functionally equivalent to a defect free IC, the repaired IC may still consume more power than the defect free IC. As just one example, while a replaced defective standard circuits may never switch between states, the manner of the defect may result in current being drawn. If such an current draw occurs while the IC is in stand-by, the IC can consume an inordinate amount of power.

An example of a defect which causes an IC to continue to draw current in the stand-by state is set forth in FIG. 1. Two conductive lines are illustrated; a first conductive line 100 which is maintained at a first voltage (V1) in the stand-by state, and a second conductive line 102 which is maintained at a second voltage (V2) in the stand-by state. It is understood that V1 is a different potential than V2. If the circuit was defect free, the two conductive lines (100 and 102) would be insulated from one another, and no current could be drawn between the two. A defect 104, however, is illustrated that creates a short circuit condition between the two conductive lines (100 and 102). The short circuit will have some inherent resistance, and so is shown as a m() resistor connecting the two conductive lines (100 and 102). Because V1 is different from V2, current will flow from the higher voltage to the lower voltage through the resistor, consuming power.

A second, more specific example of a defect which can affect power consumption is set forth in FIG. 2a. FIG. 2a illustrates an array of dynamic RAM (DRAM) cells. The array is designated by the reference character 200, and is shown to include fifteen memory cells arranged in six rows and five columns. Each of the memory cells are identified by the character Mij, where i designates a row, and j designates a column. The memory cells M00–M53 are coupled to word lines 202a–202f and bit lines 204a–204f. Each memory cell is show to include an access transistor and storage capacitor, identified by the characters Nij and Cij, respectively, where i and j, again, indicate a row and a column. The storage capacitors C00–C53 are shown to have one terminal coupled to their respective access transistor, and another coupled to a plate terminal 206. The plate terminal 206 is common to each of the memory cells.

In the particular array of FIG. 2a, the various conductive lines are placed at predetermined voltages in the stand-by state. The bit lines 204a–204f are placed at a voltage halfway between a positive supply voltage (Vcc) and a low supply voltage (Vss or ground), and so are shown to be at the potential Vcc/2. This arrangement allows the bit lines 204a–204f to be rapidly driven to either Vcc or Vss in the active cycle. The plate terminal 206 is also placed at Vcc/2. The word lines 202a–202f, on the other hand, are placed at Vss. This ensures that access transistors N00–N53 remain turned off, preventing charge from leaking from the storage capacitors to the bit lines 204a–204f.

Also illustrated in FIG. 2a are two defects; one in memory cell M22 and one in memory cell M40. The first defect 208 in M22 results in a short between the word line 202c and the plate terminal 206. In the stand-by state, current flows through the first defect 208 from the plate terminal 206 (which is at Vcc/2) to the word line 202c (which is at Vss, or zero volts). Similarly, in the vicinity of memory cell M40, the second defect 210 has created a short between bit line 204b and word line 202e. In the stand-by state current flows from the higher potential bit line 204b (at Vcc/2) to the lower potential word line 202e (at Vss).

While the row containing defect 208, and the column containing defect 210 can be replaced by redundant circuits, to provide a functional DRAM device, the defects (208 and 210) will continue to draw current in the stand-by state.

FIG. 2b sets forth a side cross sectional view of a portion of a DRAM device that illustrates two examples of short conditions. The portion of the DRAM is designated by the general reference character 220 and shown to include a trench capacitor type DRAM cell, and to include a word line 222, a bit line 224, and a plate terminal 226. A first short circuit condition 228 is shown between the word line 222 and the plate terminal 226. A second short circuit condition 230 is shown between the word line 222 and the bit line 224.

FIG. 2c provides a second side cross sectional view for a DRAM having a stacked capacitor cell. As in the case of FIG. 2b, two short circuit conditions are illustrated. The portion of the DRAM is designated by the general reference character 240, and includes the same general elements as FIG. 2b. A word line 242 is disposed on a semiconductor substrate adjacent to a bit line 244. A plate terminal 246 is disposed over the word line 242 and below the bit line 244. A first short circuit condition 248 is shown between the plate terminal 246 and the word line 242. A second short circuit condition 250 is shown between the bit line 244 and the word line 242.

Commonly-owned, co-pending U.S. patent application No. 60/064,835 illustrates a method of reducing the amount of current drawn by a memory device in the stand-by state. This application is incorporated by reference herein.

It would be desirable to provide some way of reducing the amount of current that is drawn by a semiconductor device having manufacturing defects, particularly those defects that draw current when the device is in a stand-by state.

SUMMARY OF THE INVENTION

According to the present invention, a semiconductor device may have defects that result in conductive lines being shorted to an internal voltage (short voltage). Circuits are provided to place the shorted lines at or near to the short voltage, thereby eliminating current from being drawn by the short circuit condition.

According to one aspect of the invention, the voltage level on the conductive lines is driven to the short voltage in the event the conductive lines begin to approach the short voltage.

According to another aspect of the invention, the conductive lines are addressed in a memory device, with the location of conductive lines having shorts being stored within the semiconductor device. During an active state, those conductive lines having shorts are disabled and replaced by redundant circuits according the stored location. During a stand-by state the defective lines are driven to the short voltage according to the stored location.

According to another aspect of the invention, conductive lines having shorts are isolated during the stand-by state, and the short circuit pulls the shorted conductive lines to the short voltage.

DETAILED DESCRIPTION OF THE EMBODIMENTS

The present invention will be described in terms of a number of preferred embodiments. For each embodiment, the structure of embodiment will first be described, followed by a description of the operation of the embodiment. Timing diagrams are provided for some embodiments to assist in the understanding of the operation of the embodiment.

Figure 1:
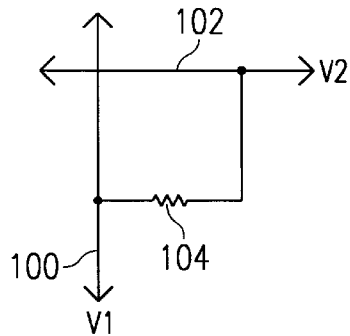
FIG. 1 is a schematic diagram illustrating a short condition.
Figure 3:
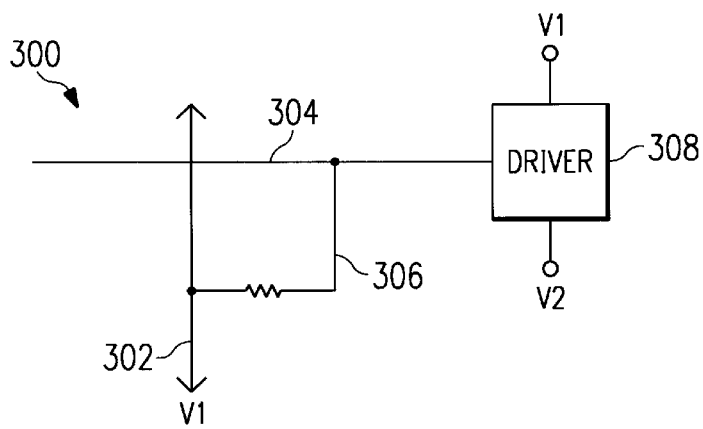
FIG. 3 is a block schematic diagram illustrating a first embodiment.

Referring now to FIG. 3, a simple block diagram is set forth illustrating a first embodiment in which the current drawn by a short circuit condition between two conductive lines is reduced by driving one of the conductive lines, so that the potential on both of the conductive lines is the same. The first embodiment is designated by the general reference character 300, and is shown to include a first conductive line 302 at a first potential (shown as V1) and a second conductive line 304. A short circuit "condition" 306 exists between the first conductive line 302 and the second conductive line 304. It is noted that the term short circuit condition should not be construed as being limited to a manufacturing defect that creates a conductive path between the conductive lines (302 and 304) through insulation layers. The short circuit condition 306 could be created by a defective active device, such as an insulated gate field effect transistor (referred herein as "MOS" transistor) having an insufficient gate voltage or insufficient threshold voltage—resulting in a "leaky" device. In addition, the short circuit condition 306 may arise from a gate oxide integrity failure in the passgate transistor of a DRAM memory cell.

In the event the second conductive line 304 is at a potential different than V1, current will flow between the conductive lines (302 and 304). Further, in the event such a voltage differential is present during a stand-by state, the short condition 306 will result in excessive power being consumed in the stand-by state. To reduce the differential voltage between the conductive lines (302 and 304), the first embodiment includes a driver circuit 308 coupled to the second conductive line 304, the first voltage V1 and a second voltage V2. When a short circuit condition exists between the conductive lines (302 and 304) the driver circuit drives the second conductive line 304 to V1, eliminating the voltage differential between the conductive lines (302 and 304), and hence any current flow between the two. In the first embodiment, the driver circuit 308 can also couple the second conductive line 304 to V2, in the event no short circuit condition exists between the two conductive lines (302 and 304) (i.e., the first conductive line 302 is insulated from the second conductive line 304).

Figure 4:
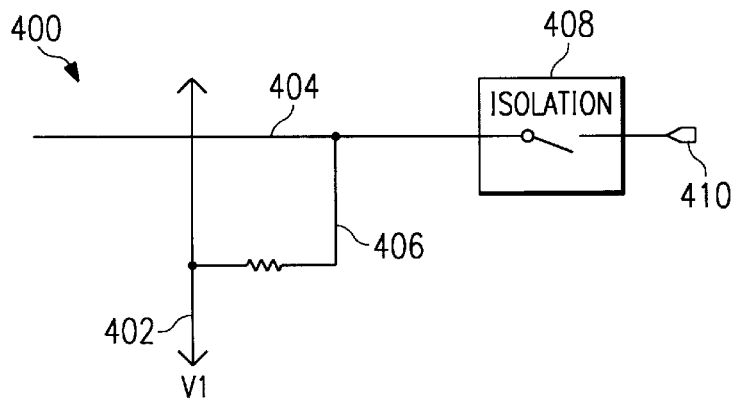
FIG. 4 is a block schematic diagram illustrating a second embodiment.

In FIG. 4, a simple block diagram is set forth illustrating a second embodiment in which the current drawn between a first conductive line at one potential and a second conductive line is reduced by isolating the second conductive line from any other voltages (i.e., placing the second conductive line in a floating state) in the event a short circuit condition exists between the first conductive line and the second conductive line. Once in the floating state, the short circuit condition charges (or discharges) the second conductive line to the first potential. The second embodiment is designated by the general reference character 400, and is shown to include many of the items set forth in FIG. 3: a first conductive line 402 at a first potential (shown as V1), a second conductive line 404, and a short circuit condition 406 between the two conductive lines (402 and 404).

Unlike the first embodiment of FIG. 3, the second embodiment 400 includes an isolation circuit 408 situated between the second conductive line 404 and an external input node 410. The external input node 410 receives input signals from other circuits (not shown in FIG. 4). The input signals are coupled to, or alternatively, isolated from, the second conductive line 404 according to the operation of the isolation circuit 408. The operation of the isolation circuit 408 varies according to the presence or absence of a short circuit condition 406 in between the conductive lines (402 and 404). In the event a short circuit condition 406 exists, the isolation circuit 408 introduces a high impedance path between the external input node 410 and the second conductive line 404. This would ordinarily places the second conductive line in a "floating" state. However, due to the short circuit condition 406, current will flow between the two conductive lines (402 and 404). The potential of the second conductive line 404 will begin to approach V1, reducing the differential voltage between the conductive lines (402 and 404), until the both lines are substantially at the same potential (V1) with no current flowing between the two.

In the event no short circuit condition exists (the conductive lines 402 and 404 are insulated from one another), the isolation circuit 408 can provide a low impedance path between the external input node 410 and the second conductive line 404, to allow the second conductive line 404 to be driven to various voltages by potentials applied to the external input node 410.

In one example, the integrated circuit 400 may be a memory device. In this case, the first conductive line 404 could be a word line, while the second conductive line 402 could be a bit line or a cell plate. In this example, isolation device 408 could be an isolation transistor coupled between word line 404 and a node 410 of a row decoder (not shown).

Figure 5:
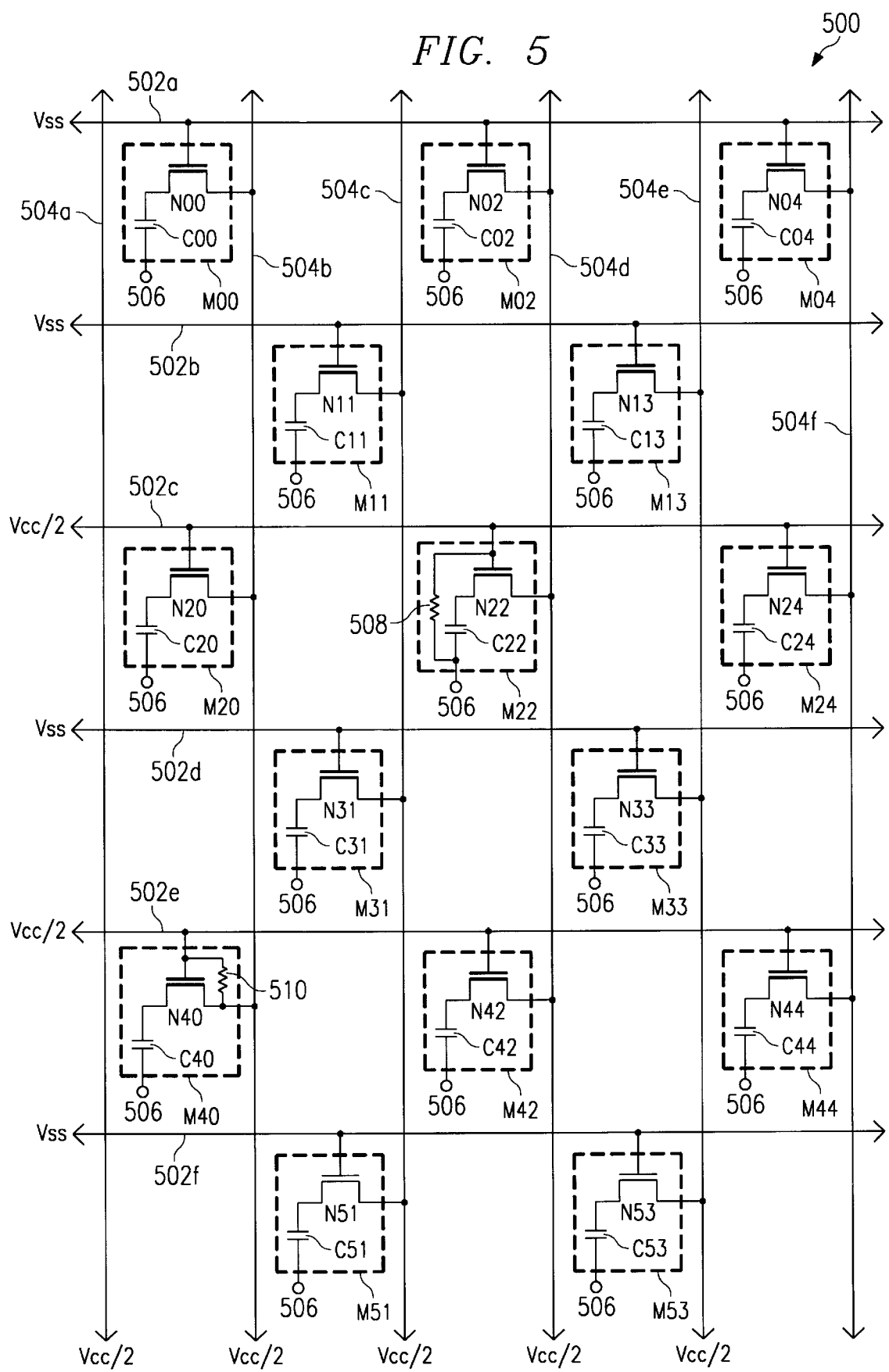
FIG. 5 is a schematic diagram illustrating a third embodiment.

A more detailed third embodiment is illustrated in FIG. 5 in a schematic diagram. The third embodiment is an array of DRAM cells. In the third embodiment, the various conductive lines of the array are placed at different voltages in order to reduce the amount of current drawn by the DRAM in a stand-by mode (or state). A DRAM stand-by mode is entered into, as one example, when the memory cells of the DRAM are not being accessed. The array of FIG. 5 has many elements similar to those set forth in FIG. 2a, accordingly, like elements will be referred to by the same reference character.

In FIG. 5, the DRAM array is designated by the general reference character 500, and is shown to include fifteen memory cells arranged in six rows and five columns. The memory cells are identified by the character Mij, where i designates a row (from 0–5) and j designates a column (from 0–4). Each memory cell includes a storage capacitor (shown as Cij, where i and j designate row and column) and an access transistors (shown as Nij, where i and j designate row and column). The memory cells of the same row are commonly coupled to a word line (502a–502f) by the gates of their respective access transistor. The memory cells of the same column are commonly coupled to a bit line (504a–504f) by the drain of their respective access transistor. The storage capacitors (C00–C53) are each coupled between the sources of their respective access transistor (N00–N53) and a plate terminal 506. In the particular embodiment of FIG. 5, the plate terminal 506 can be common between all of the memory cells (M00–M53).

Figure 2A:
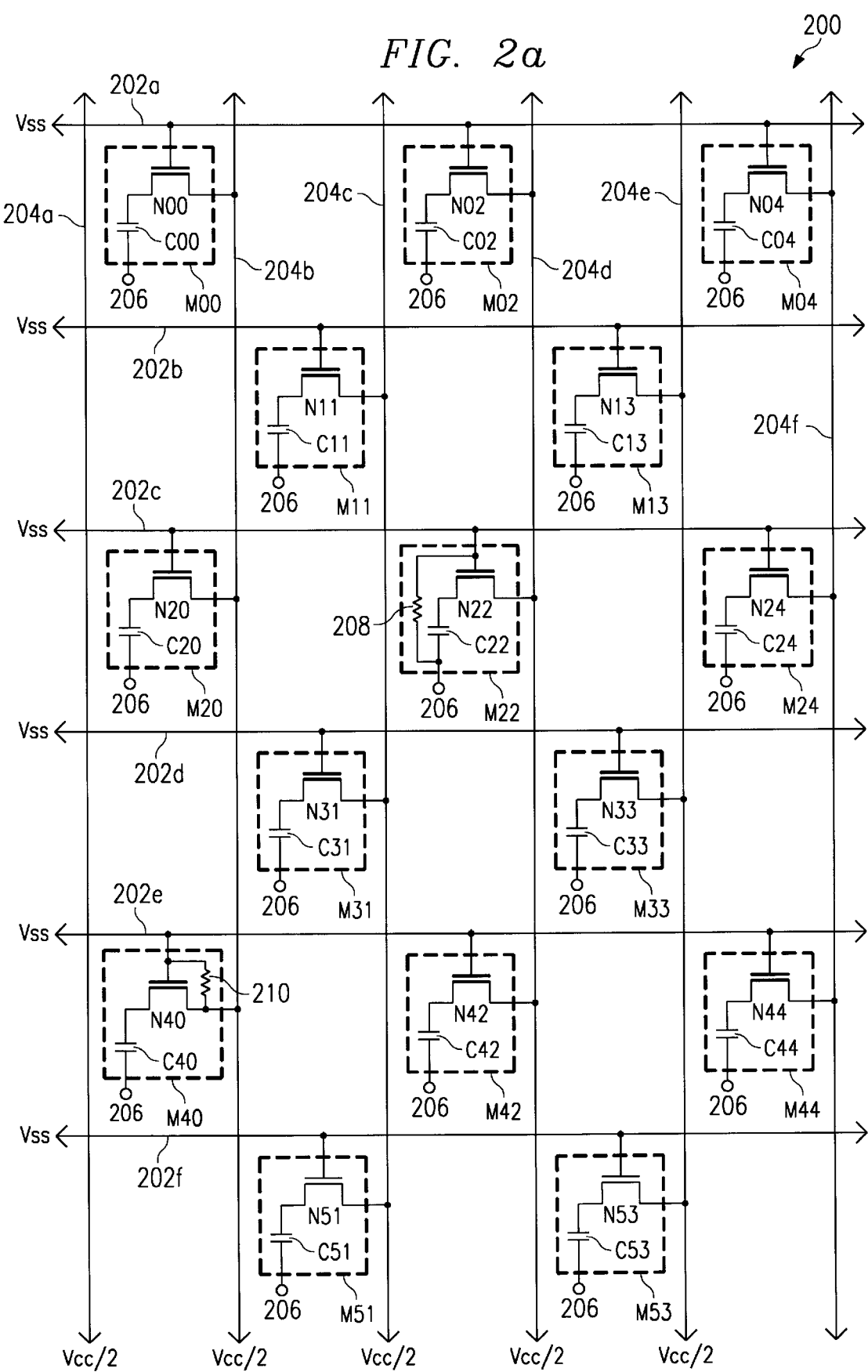
FIG. 2a is a schematic diagram illustrating a DRAM memory array having two memory cells with defects that result in short circuit conditions to word lines.
Figure 2B:
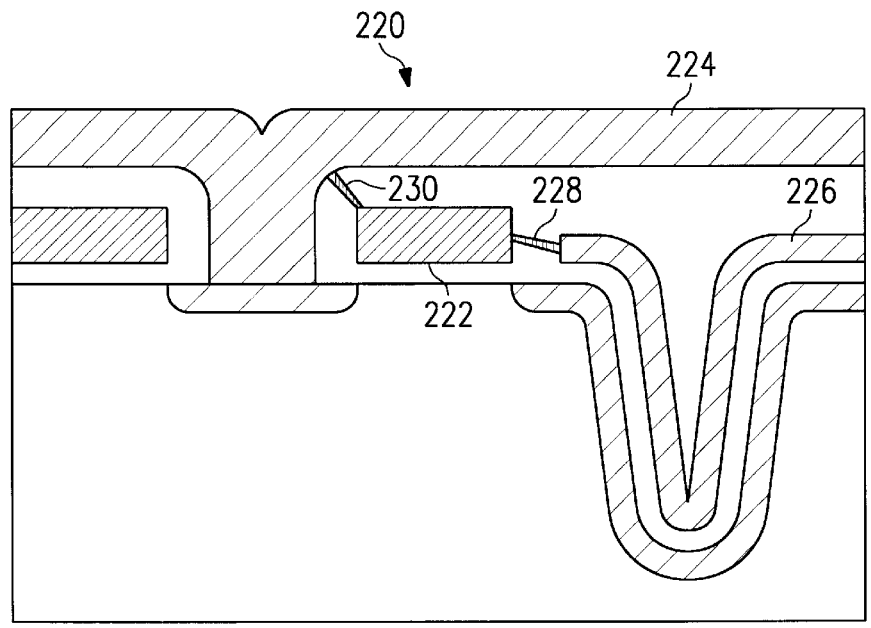
FIGS. 2b and 2c set forth side cross sectional views illustrating short circuit conditions in two types of DRAMs.
Figure 2C:
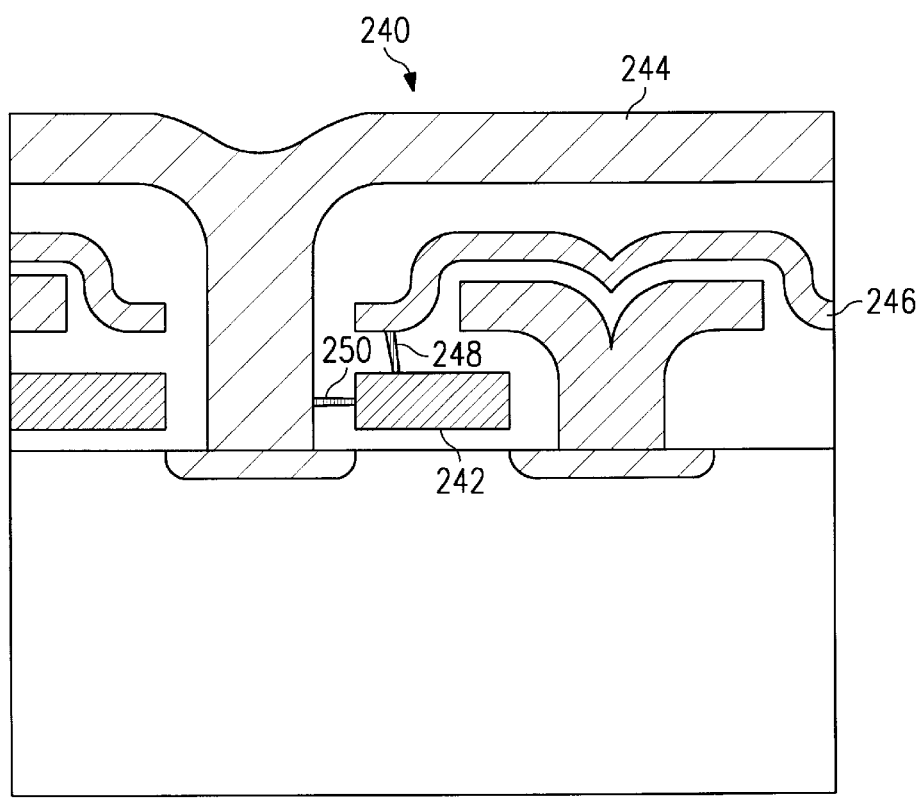

The memory cell array 500 of FIG. 5, like that of FIG. 2a, includes a first defect 508 at memory cell M22 and a second defect 510 at memory cell M40. The first defect 508 results in a short circuit condition between the plate node 506 and word line 502c. The second defect 510 results in a short circuit condition between word line 502e and bit line 504b.

The array 500 of FIG. 5 is illustrated in the stand-by mode. As in the case of the array set forth in FIG. 2a, in the stand-by mode, the bit lines 504a–504f and the plate terminals 506 are charged to a first voltage (Vcc/2). Unlike the prior art, the word lines 502a–502f of array 500 are biased differently according to whether or not a short circuit condition is present on the word line. In the event no short circuit condition exists, the word line is biased to Vss. In contrast, in the event a word line is shorted to another voltage (a "short" voltage) the word line is biased to that short voltage. For example, in FIG. 5, the first defect 508 creates a short circuit condition between word line 502c and the plate terminal 506 (which is biased to Vcc/2). Accordingly, the word line 502c is biased to Vcc/2, essentially eliminating current flow between the word line 502c and the plate terminal 506. In the same fashion, the second defect 510 creates a short circuit condition between bit line 504b (also at Vcc/2) and word line 502e. Accordingly, the potential of word line 502e is also altered to reduce (in this particular case—essentially eliminate) current flow from the bit line 504b to the word line 502e, by raising the word line voltage to Vcc/2 in the stand-by mode.

Figure 6:
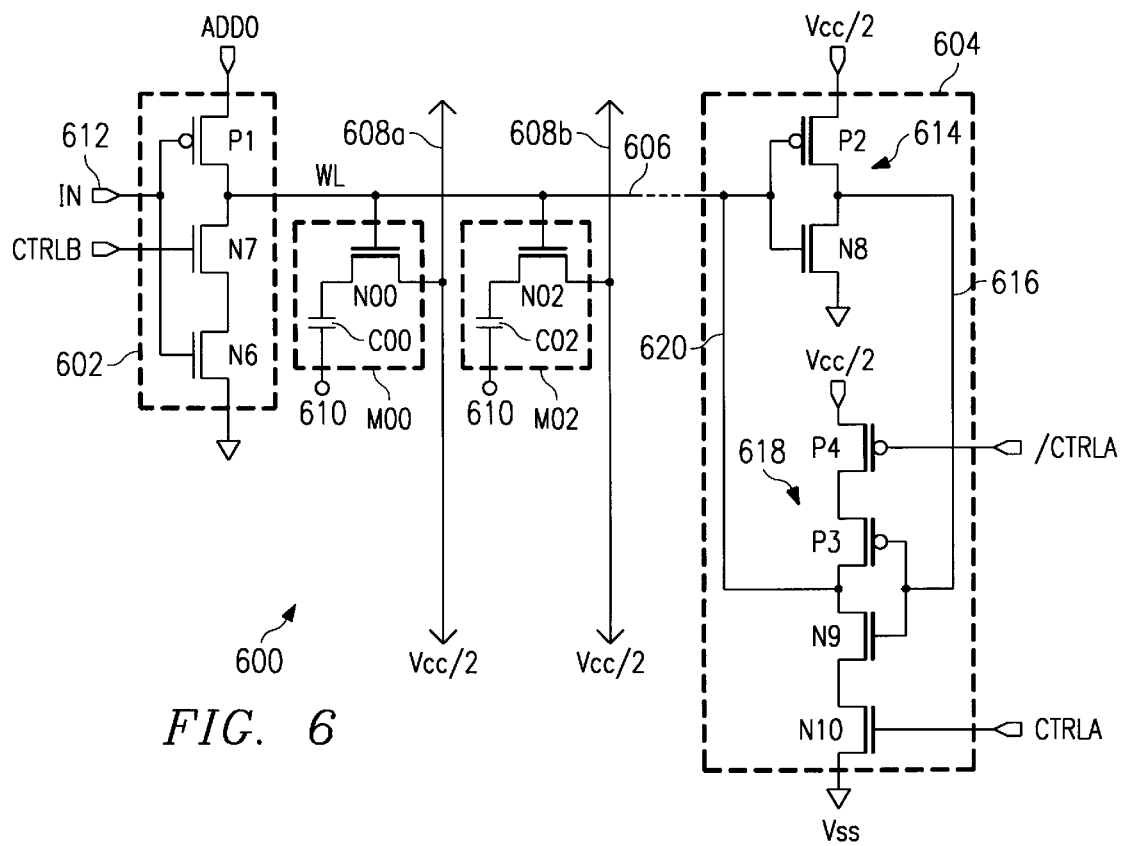
FIG. 6 is a schematic diagram illustrating a fourth embodiment.

In FIG. 6, a fourth embodiment is illustrated in a detailed schematic diagram. The fourth embodiment is designated by the general reference character 600, and sets forth a driver circuit 602 and a sense and latch circuit 604 coupled to a word line 606. Two representative memory cells (M00 and M02) are shown coupled between word line 606 and two bit lines (608a and 608b). The memory cells of the particular embodiment set forth are DRAM cells and so each include an access transistor (N00 and N02) and a storage capacitor (C00 and C02). The storage capacitors (C00 and C02) are commonly coupled to plate terminal 610.

The driver circuit 602 includes p-channel pull-up transistor P1 having a source coupled to receive an address signal ADD0, a drain coupled to the word line 606, and a gate coupled to input node 612. Two n-channel transistors (N6 and N7) are coupled in series between the word line 606 and Vss (ground). The gate of N6 is coupled to input node 612, while the gate of N7 is driven by the control signal CTRLB. It is noted that the source drain path of N7 is situated between the word line 606 and the source drain path of N6. The sources of transistors P1 and N6 can be conceptualized as "drive" nodes, as the word line can be driven between the voltages at these two nodes.

The driver circuit 602 operates differently according to the status of the CTRLB signal. In the event the CTRLB signal is high, N7 is turned on, and the driver circuit 602 functions essentially like a complementary MOS (CMOS) inverter. In the event the CTRLB signal is low, the pull-down path (to Vss) is disabled, and the driver circuit 602 cannot drive the word line 606 low.

In the preferred embodiment, ADD0 signal will vary between Vpp (a voltage above the positive supply voltage, Vcc) and Vss according to an applied address. For example, when the word line 606 is selected by an address, the input node 612 will be driven low, and ADD0 will be at Vpp. This condition turns on P1, and drives the word line 606 to Vpp. When the word line 606 is de-selected, the input node 612 will go high and N6 will turn on. Assuming N7 is also on (by CTRLB being high) the word line 606 will be pulled down to Vss. A second way of de-selecting word line 606 would be to drive the input node 612 low, but have ADD0 at Vss.

In addition to the driver circuit 602, the sense and latch circuit 604 is also coupled to the word line 606. According to the fourth embodiment, the sense and latch circuit 604 includes a sense driver 614 formed by complementary transistor pair P2 and N8 arranged in the manner of a CMOS inverter. The gates of P2 and N8 are coupled to the word line 606, with the drain of P2 being coupled to the voltage Vcc/2. The output of the sense driver 616 is coupled to the input of a three-state driver 618. It is noted that the level at which the sense and latch circuit 604 senses a rise in the word to line voltage can be adjusted by changing the trigger voltage of the sense driver 616 (i.e., the voltage required for the sense driver to drive its output 616 low).

The three-state driver 618 includes another complementary pair of transistors P3 and N9, the gates of which form the three-state driver input. The source of P3 is coupled to the Vcc/2 voltage by way of transistor P4. Similarly, the source of N9 is coupled to Vss by way of transistor N10. The gate of N10 receives a CTRLA signal, and the gate of P4 receives the inverse of the CTRLA signal (shown as /CTRLA). In the event CTRLA is high (and /CTRLA low), P4 and N10 are turned on, and the three-state driver 618 functions essentially as an inverter, driving its output 620 between a first and second state (Vcc/2 and Vss) according to the output of the sense driver 616. Thus, when CTRLA is high, the sense driver 614 and three-state driver 618 together function as a latch, to latch the word line 606 at a given voltage (Vcc/2 or Vss). In the event CTRLA is low (and /CTRLA is high) the three-state driver 618 is placed in a third state, in which its output 620 is left floating.

Figure 7:
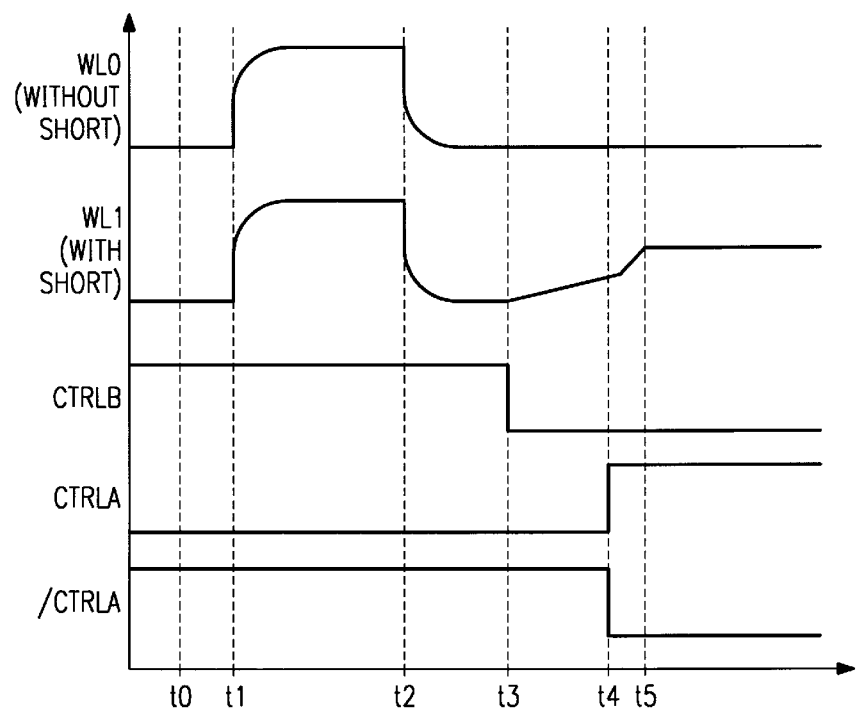
FIG. 7 is a timing diagram illustrating the operation of the fourth embodiment set forth FIG. 6.

Referring now to FIG. 6 in conjunction with FIG. 7, the operation of the fourth embodiment 600 will be described. FIG. 7 illustrates two word line responses; one for a word line having no defect (WL0) and one for a word line having a short circuit condition (WL1). The short circuit condition, is to a node (a "short" node) at the potential Vcc/2. Such a condition could occur were the word line 606 shorted to the bit lines 608a–608b or to the plate terminal 610.

The operation of "good" word line WL0 (one without a short circuit condition) will be described first. At time $t_0$, the word line is de-selected, and the WL0 is at Vss. The signal CTRLB is high, and so the driver circuit 602 is fully enabled. In contrast, CTRLA is low, and so the three-state driver 618 is placed in the third state, and the sense and latch circuit 604 is disabled. At time $t_1$, word line WL0 is selected, and the fourth embodiment circuit enters the active state. The word line WL0 is driven to Vpp by operation of driver circuit 602. Because CTRLA remains low, the sense and latch circuit 604 has no effect on the word line 606 voltage. At time $t_2$, the WL0 is de-selected. The driver circuit 602, by way of transistors N6 and N7, pulls the word line WL0 down to Vss. At time $t_3$, the signal CTRLB goes low, turning off N6. At this time, the fourth embodiment is in the stand-by state, with the word line 606 floating (at Vss). At time $t_4$, CTRLA goes high (and /CTRLA goes low) enabling three-state driver 618, and hence the sense and latch circuit 604. The low voltage of word line WL0 (Vss) turns on transistor P2, and the output of sense driver 616 is pulled high (to Vcc/2). In this manner the sense and latch circuit 614 "senses" the de-select voltage of the word line WL0. The high voltage and output 616 turns on transistor N9. Because transistor N10 is turned on by signal CTRLA being high, the output of the three-state driver 618 is driven to Vss. The word line is latched at the de-select voltage (Vss).

Referring now to the timing diagram for WL1, the response of a word line having a short circuit condition to the potential Vcc/2 will be described. The shorted word line WL1 is shown to generally follows the response of the good word line from time $t_0$ to time $t_3$. The word line WL1 is driven to Vpp in a select operation during the active mode. When CTRLB goes low at time $t_3$, N7 will be turned off, and the word line WL1 is left floating in the stand-by state. Unlike the defect free word line WL0, word line WL1 is shorted to Vcc/2, so the potential of the word line WL1 will begin to rise, and approach the voltage Vcc/2. At time $t_4$, CTRLA goes high (and /CTRLA goes low) and the sense and latch circuit 604 is enabled. Assuming the potential on the word line 606 is greater than the trigger voltage of the sense driver circuit 614, P2 will turn off and N8 will turn on, driving the output 616 to Vss. In response to the low voltage at node 616, the three-state driver goes high, driving the word line 606 rapidly to Vcc/2. At time $t_3$, the word line WL1 is latched at Vcc/2, preventing any further current leakage due to the short circuit condition. In this manner, the sense and latch circuit 604 senses the voltage on the word line, and if it begins approaching the Vcc/2 from Vss, drives the word line to Vcc/2 and latches it at that potential.

Figure 8:
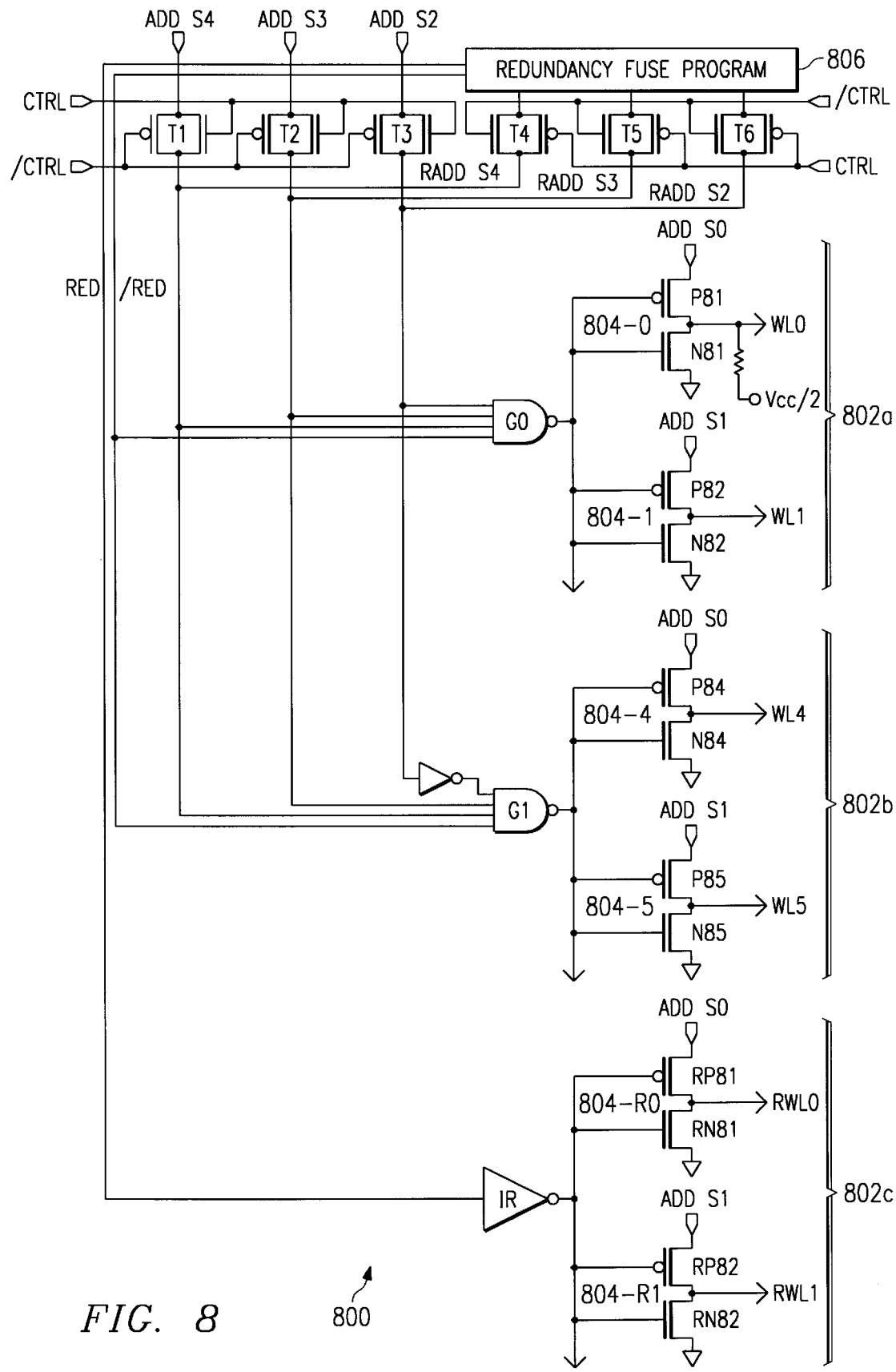
FIG. 8 is a schematic diagram illustrating a fifth embodiment.

Referring now to FIG. 8, a fifth embodiment of the present invention is set forth in a schematic diagram. The fifth embodiment illustrates a random access memory in which a word line having a short circuit condition is driven to a disable voltage in an active mode, and to a "short" voltage in a stand-by mode. In addition, the address of the word line having the short circuit condition is stored, so that the defective word line can be replaced by a "good" redundant word line.

In FIG. 8, the fifth embodiment is designated by the general reference character 800, and is shown to include three groups of word lines, shown as 802a–802c. The first group of word lines 802a includes standard word lines WL0 and WL1, with WL0 having a short circuit condition to Vcc/2. The second group of word lines 802b includes standard word lines WL4 and WL5, neither of which includes a short circuit condition. The third group of word lines 802c is a group of redundant word lines, two of which are shown in FIG. 8 as RWL0 and RWL1. It is understood that each word line group includes four word lines altogether (only two of which are shown), and could, in other embodiments, include a smaller or greater number of word lines.

Both the standard word lines and redundant word lines are driven by word line drivers, shown as 804-0, 804-1, 804-4, 804-5, and 804-R0 and 804-R1. Each of the word line drivers has the same general configuration as a CMOS inverter, including a p-channel pull-up driver transistor (P81, P82, P84, P85, RP81, and RP82) and an n-channel pull-down driver transistor (N81, N82, N84, N85, RN81, and RN82). All the drivers of a given group of standard word lines (802a–802b) are commonly activated by decoder NAND gate (G0–G2). For example, word lines drivers 804-0 and 804-1 are activated by G0, and word line drivers 804-4 and 804-5 are activated by G1. Thus, G0 and G1 can be conceptualized as standard decoders. The drivers of the group of redundant word lines (802c) are commonly activated by inverter RI, which can be conceptualized as a "redundant" decoder.

The standard decoders G0 and G1 are coupled to an address bus, and receive address signals ADD S2, ADD S3, and ADD S4. These signal, in conjunction with the signals ADD S0 and ADD S1 determine whether a word line is selected or de-selected. The standard decoders (G0 and G1) also receive an inverse redundant enable signal (/RED). In the event the /RED signal is low, all of the standard decoders will be disabled, and the standard word lines will be de-selected. Inverter IR, receives a redundant enable signal (RED), and so will be activated when RED goes high.

The RED and /RED signals are generated by a redundancy fuse program circuit 806, which can be programmed to store the address of a defective word line (i.e., a word line having a short circuit condition to Vcc/2). If the defective word line address is received by the redundancy fuse program circuit 806, RED will go high and /RED will go low. For any other address (i.e., all good addresses) RED will remain low and /RED will go high. In the particular embodiment illustrated in FIG. 8, WL0 contains a short circuit condition to Vcc/2. Accordingly, WL0 should not be accessed in the active cycle. To prevent such an access, the redundancy fuse program circuit 806 stores the address corresponding to G0 (the decoder corresponding to the "bad" word line WL0). When the address signals ADD S2–ADD S4 are received that would ordinarily activate G0, the redundancy fuse program circuit 806 will generate a high RED signal, and a low /RED signal. As will be described in more detail below, these signals will bypass access to word line WL0.

In addition to address signals ADD S2–ADD S4, the standard decoders (G0 and G1) can also receive pre-determined address information from the redundancy fuse program circuit 806. The providing of either standard address information (i.e., address information generated from an externally applied address) or defective address information (i.e., the location of the word line having a short circuit condition) is accomplished by operation of transfer gates T1–T6. The transfer gates T1–T6 are enabled or disabled according to the signal CTRL and its complement /CTRL. In the event CTRL is high (and /CTRL is low) transfer gates T1–T3 will be enabled, and ADD S4–ADD S2 will be applied to the standard decoders (G0 and G1). In the event CTRL is low, redundant address signals RADD S4–RADD S2, generated from the redundancy fuse program circuit 806, are applied to the standard decoders (G0 and G1).

Referring now to FIG. 8 in conjunction with the timing diagram of FIG. 9, the operation of the fifth embodiment will be described. At time $t_0$, a clock signal /CLK is applied to the device, initiating an active cycle. The clock signal can be a row address strobe (/RAS)—in the case of a conventional DRAM, an address transition detection signal—in the case of another asynchronous device (such as an asynchronous static RAM or read only memory, such as an EEPROM), or the clock signal of a synchronous memory device. The active cycle may be a read operation, write operation, program operation or erase operation.

Figure 9:
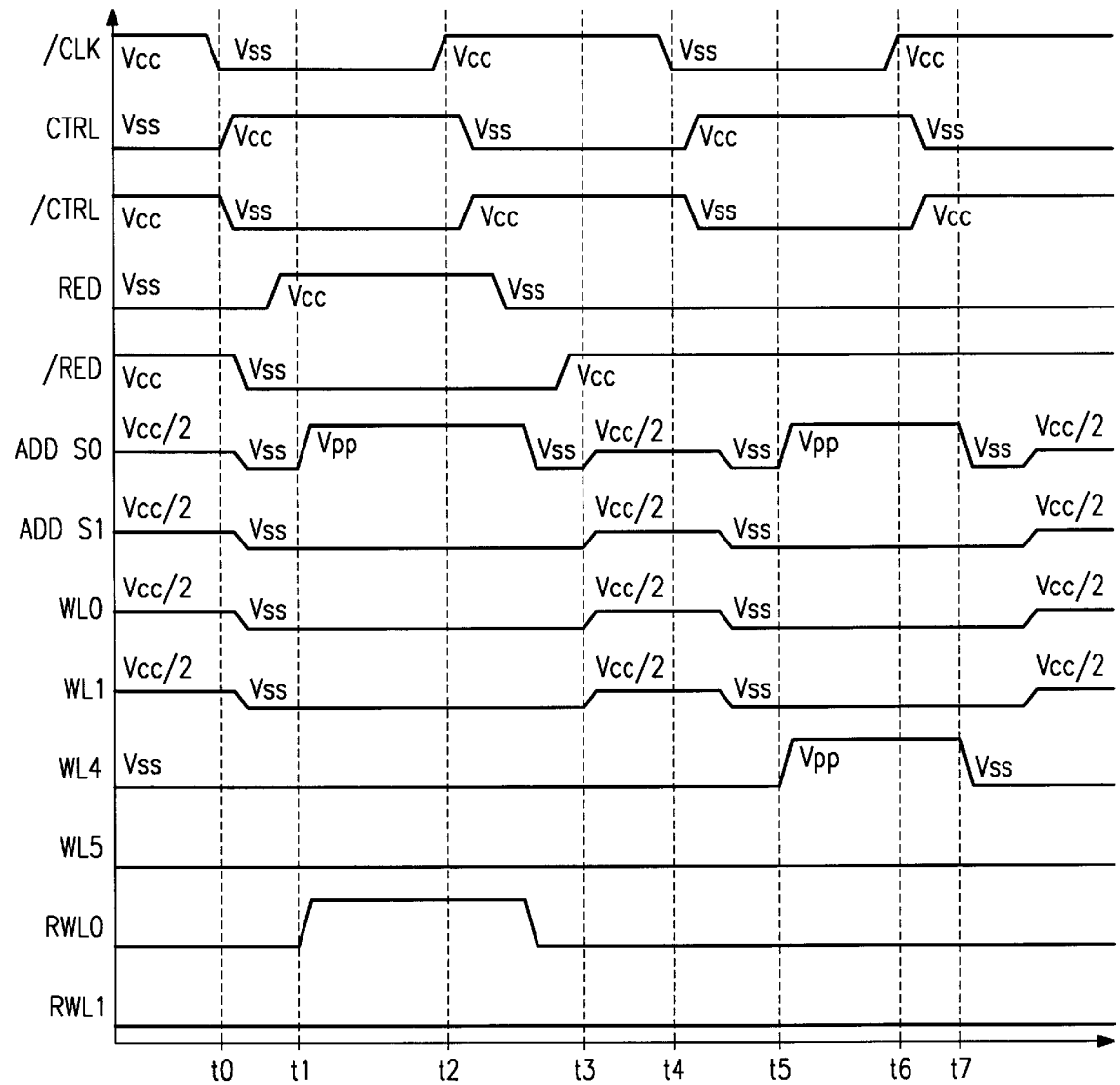
FIG. 9 is a timing diagram illustrating the operation of the fifth embodiment set forth FIG. 8.

The first active cycle described by FIG. 9 is a redundant circuit access. A word line containing a defect (WL0) is bypassed, and a redundant word line (RWL0) is activated in its place. At time $t_1$, CTRL goes high, and /CTRL goes low. Transfer gates T1–T3 are enabled and T4–T6 are disabled. With T1–T3 enabled, the address signals ADD S2–ADD S4 are coupled to the standard decoders (G0 and G1). However, because the initial address signals correspond to the decoder G0, the redundancy fuse program circuit 806 will drive /RED low. With /RED low, all of the standard decoders (G0 and G1) are disabled, generating high outputs. The pull-down devices of the standard drivers (N81, N81, N84 and N85) are enabled, and the standard word lines (WL0, WL1, WL4 and WL5) are pulled low (to Vss). It is also noted that address signals ADD S0 and ADD S1 are also pulled to Vss at time $t_0$. In this manner, all of the word lines are initially placed in a de-select state.

At time $t_1$, signal RED will go high. The high RED signal is applied to inverter IR, and IR selects redundant word line group 802c. Referring once again to FIG. 9, around time $t_1$, address signal ADD S0 rises to Vpp, while ADD S1 remains at Vss. This provides the last level of decoding for selecting one word line within the redundant word line group 802c. With the output of inverter IR low, and ADD S0 at Vpp, word line RWL0 is driven to Vpp. In this manner, an active cycle that accesses WL0 is re-routed to redundant word line RWL0.

At time $t_2$, the /CLK signal goes high, terminating the active cycle and placing the device in the stand-by state. Following /CLK going high, CTRL goes low and /CTRL goes high. Transfer gates T1–T3 are turned off, and T4–T6 are turned on. The redundant address signals RADD S2–RADD S4, which are pre-determined to correspond to the word line (WL0) containing a short, are thus coupled to the standard decoders (G0 and G1). Decoder G0 is activated, and drives its output low, selecting all the word line drivers (804-0 and 804-1) corresponding to the first word line group 802a. Decoder G1 remains de-activated, and so the word line drivers (804-4 and 804-5) remain de-selected (coupled to Vss). Similarly, RED goes low and the output of inverter IR goes high, and the redundant word lines (RWL0 and RWL1) are de-selected. Thus, in the stand-by state, the defect free word line groups are de-selected, while the word line group (or groups) containing the short circuit condition is selected.

At about time $t_3$, address signals ADD S0 and ADD S1 rise from Vss to a "short" voltage (the voltage Vcc/2 that word line WL0 is shorted to). Because decoder G0 has selected the drivers of the first word line group (804-0 and 804-1), the word lines in the first group (WL0 and WL1) are pulled to the short voltage by way of the their pull-up devices (P81 and P82). In this manner, in the stand-by mode, the group of word lines containing the short circuit condition are commonly driven to the short voltage according to address information provided by the redundancy fuse program circuit 806.

Referring once again to FIG. 8 in conjunction with FIG. 9, the operation of the fifth embodiment will be described for the access of a "good" standard word line (i.e., one without a short circuit condition). At time t4, the /CLK goes low once again. CTRL goes high and /CTRL goes low. By operation of the transfer gates T1–T6, standard address signals ADD S2–ADD S4 are applied to the standard decoders (G0 and G1). In the particular example of FIG. 9, the standard address signals activate gate G1. The address signals ADD S0 and ADD S1 both fall from Vcc/2 to Vss. At about time $t_5$, ADD S0 rises to Vpp (while ADD S1 remains at Vss) resulting in the selection of word line WL4. WL4 is driven to Vpp by operation of pull-up device P84.

The second active cycle ends about time $t_6$, with the rising of the /CLK signal. CTRL goes low and /CTRL goes high once more, and the redundant address information is applied to the gates, resulting in the activation of G0. At about time $t_7$, Address signal ADD S0 falls to Vss de-selecting all the word lines. The device returns to the low current state at about time $t_8$, when ADD S0 and ADD S1 rise to Vcc/2, driving the "bad" word line WL0 to Vcc/2 once again, alleviating the adverse power effects caused by the short from WL( to Vcc/2.

Figure 10:
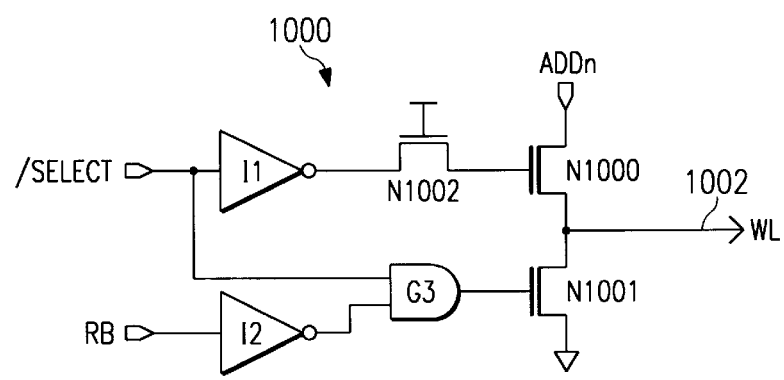
FIG. 10 is a schematic diagram illustrating a sixth embodiment.
Figure 11:
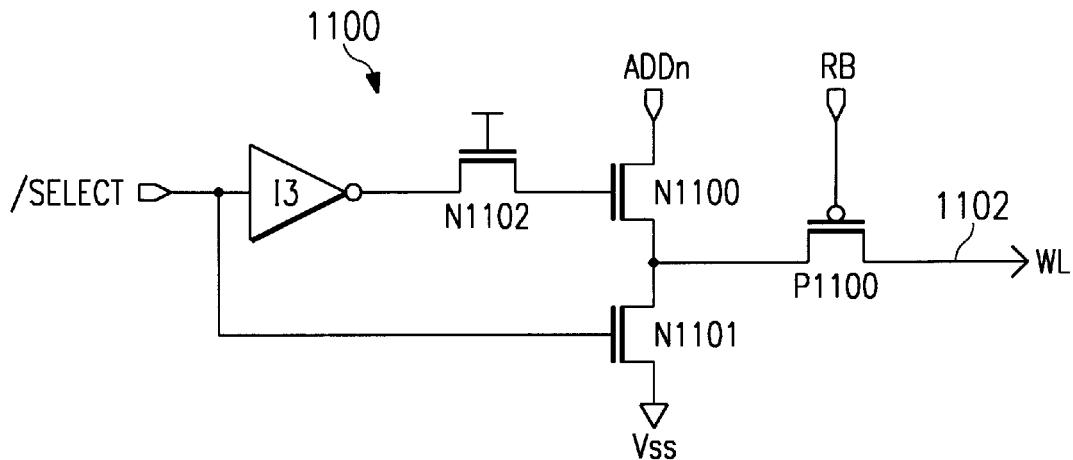
FIG. 11 is a schematic diagram illustrating a seventh embodiment.

FIGS. 10 and 11 present sixth and seventh embodiments in which a word line having a short circuit condition need not be driven, or latched to a "short" voltage. Instead, the word line is isolated from other circuits (placed in a floating state) and the short circuit condition is allowed to charge/discharge the word line to the short voltage.

Referring now to FIG. 10 the sixth embodiment is designated by the general reference character 1000, and is shown to include a word line 1002 coupled to a driver formed by pull-up device N1000 and pull-down device N1001. The drain of N1000 receives the word line signal ADDn. The source of N1000 is coupled to the word line 1002. The source-drain path of N1001 is coupled between the word line 1002 and Vss. The gate of N1000 is coupled to the output of an inverter I1, by passgate transistor N1002. The input of I1 receives a /SELECT signal. The gate of N1001 is driven by two-input AND gate G3. One input of the AND gate is the /SELECT signal, the other input is the signal RB applied by way of inverter I2. The signal RB is active (high) when the word line 1002 is not to be accessed. For example, in the event the word line 1002 has a short circuit condition to another voltage. RB can be generated by redundancy circuits which indicate the word line 1002 is be replaced, or alternatively, by a clock signal which designates the beginning of a stand-by mode.

Figure 12:
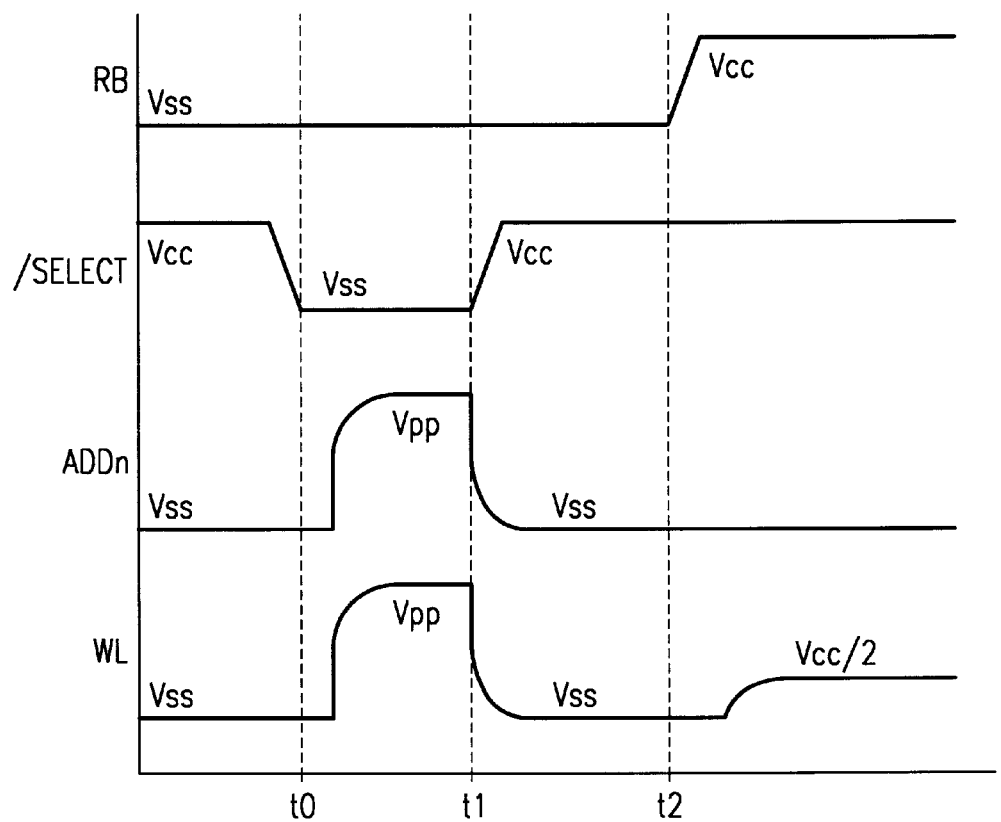
FIG. 12 is a timing diagram illustrating the operation of the embodiments set forth in FIGS. 10 and 11.

Referring now to FIG. 10 in conjunction with FIG. 12, the operation of the sixth embodiment 1000 will be described. At time $t_0$, the signal RB is low, and /SELECT goes low, indicating the word line 1002 has been activated. The low /SELECT signal generates a low at the output of G3, and turning off N1001. The low /SELECT signal passes through I1, and the high output of I1 is applied to the gate of N1000 through N1002. N1000 is turned on providing a low impedance path between the word line 1002 the signal ADDn.

ADDn is high, and the word line 1002 is driven high. In this manner, the word line 1002 is selected in an active cycle.

At time $t_1$, the word line 1002 is de-selected by /SELECT going high. As /SELECT goes high, the low output of inverter I1 is coupled through N1002 to the gate of N1000, turning off N1000. The high /SELECT signal is applied to G3, and in combination with the high output of I2, turns on N1001, coupling the word line 1002 to Vss. In this manner the word line 1002 is de-selected in an active cycle.

At time $t_2$, the RB signal goes high, resulting in the isolation of the word line 1002. With /SELECT high, N1000 remains turned off. With RB high, a low input is applied to G3, and the output of G3 goes low, turning off N1001 as well. With N1000 and N1001 both turned off, the word line 1002 is left in a floating state. In the event the word line 1002 is shorted to a particular potential, the word line 1002 will approach (i.e., charge are discharge to) the potential. In the example set forth in FIG. 12, the word line 1002 is shorted to the short potential Vcc/2, accordingly, the word line 1002 approaches, and eventually rises to a potentially essentially equal to Vcc/2. Thus, the combination of a de-select signal and isolation signal (RB) isolate the word line 1002 in a stand-by state.

Referring now to FIG. 11, a seventh embodiment is set forth in a schematic diagram. In a similar fashion to the sixth embodiment, the seventh embodiment includes a pull-up device N1100 and a pull-down device N1101. Further, a /SELECT signal is applied through an inverter 13 and passgate transistor N1102 to the gate of the pull-up transistor N1100. The drain of N1100 receives an ADDn signal. Unlike the sixth embodiment, the /SELECT signal is applied directly to the gate of the pull-down transistor N1101. A word line 1102 is coupled to the pull-up transistor N1100 and pull-down transistor N1101, by isolation transistor P1100. The gate of P1100 receives the RB signal.

Referring now to FIG. 11 in conjunction with FIG. 12, the operation of the seventh embodiment 1100 will be described. At time $t_0$, the signal RB is low, and /SELECT goes low, indicating the word line 1102 has been activated. As in the case of the sixth embodiment, the low /SELECT signal turns on the pull-up device N1100. The low /SELECT signal at the gate of N1101 turns the pull-down device off. Because RB is low, P1000 is turned on, and if ADDn is high, the word line 1102 is driven to a high voltage. In this manner the word line 1102 is selected.

At time $t_1$, the word line 1102 is de-selected by /SELECT going high. As /SELECT goes high, N1100 is turned off, and N1101 is turned on. Because RB is still low, P1100 is turned on, and the word line 1102 is pulled down to Vss. In this manner, the word line 1102 is de-selected.

At time $t_2$, the RB signal goes high, resulting in the isolation of the word line 1102. With RB high, P1100 is turned off, and a high impedance path is created between the word line 1102 and the pull-up N1100 and pull-down N1101 devices. In this manner, the word line 1102 is placed in the floating state, and if shorted to another voltage, allowed to approach, and eventually reach that voltage. Thus, in the embodiment of FIG. 11, isolation of the word line 1102 is accomplished by the operation of the RB signal, without also requiring a de-select condition.

Although the present invention has been described in detail, it should be understood that various changes, substitutions, and alterations can be made without departing from the spirit and scope of the invention as defined by the appended claims.

What is claimed is:

1. In a semiconductor device having a stand-by state, a circuit for reducing the current drawn by the semiconductor device in the stand-by state, comprising:

a first conductive member charged to a first potential in the stand-by state;

a second conductive member; and a stand-by circuit coupled to the second conductive member, the stand-by circuit placing the second conductive member generally at the first potential in the stand-by state when the second conductive member has a short circuit condition with the first conductive member.

2. The circuit of claim 1, wherein:

as the semiconductor device is a memory device and the second conductive member is a word line.

3. The circuit of claim 1, wherein:

the semiconductor device is a memory device and the first conductive member is a bit line.

4. The circuit of claim 1, wherein:

the semiconductor device is a memory device having a plurality of memory cells commonly coupled to the first conductive member.

5. The circuit of claim 4, wherein:

the memory cells include dynamic random access memory cells having storage capacitors; and the first conductive member is a capacitor plate member commonly coupled to a plurality of the storage capacitors.

6. The circuit of claim 1, wherein:

the semiconductor device is a memory device having a plurality of memory cells coupled to bit lines; and the first conductive member is a bit line.

7. The circuit of claim 1, wherein:

the first conductive member is fabricated from a different conductive layer than the second conductive member.

8. The circuit of claim 1, wherein:

the first conductive member is a portion of the substrate.

9. The circuit of claim 1, wherein:

the stand-by circuit couples the second conductive member to the first potential in response to the second conductive member approaching the first potential from a second potential.

10. The circuit of claim 9, wherein:

the stand-by circuit includes a latch for latching the second conductive member at the first potential.

11. The circuit of claim 10, wherein:

the latch includes a feedback path that is enabled in the stand-by state.

12. The circuit of claim 11, wherein:

the latch is disabled when the semiconductor device is in an active state.

13. The circuit of claim 1, including:

the stand-by circuit places the second conductive member at a second potential when the second conductive member is insulated from the first conductive member.

14. The circuit of claim 13, wherein:

the semiconductor device includes a power supply voltage; and the second potential is the power supply voltage.

15. The circuit of claim 13, wherein:

the semiconductor device is a memory device having a plurality of memory cells, access to the memory cells being prevented by the application of a de-select voltage to the memory cells; and the second potential is a de-select voltage.

16. The circuit of claim 15, wherein:

the second conductive element is a word line.

17. The circuit of claim 1, wherein:

the stand-by circuit includes a driver circuit that drives the second conductive member to the first potential in the stand-by state when the second conductive member has a short circuit condition with the first conductive member.

18. The circuit of claim 17, wherein:

the driver circuit includes a transistor having a gate, a drain coupled to the second conductive member, and a source, the source being coupled to the first potential in the stand-by state.

19. The circuit of claim 17, wherein:

the driver circuit drives the second conductive member to the first potential when activated, and the stand-by circuit further includes a decoder that activates the driver circuit in the stand-by state when the second conductive member has the short circuit condition with the first conductive member.

20. The circuit of claim 19, wherein:

the decoder disables the driver circuit when the second conductive member is insulated from the first conductive member.

21. The circuit of claim 19, wherein:

the stand-by circuit includes a storage circuit for indicating when the second conductive member has a short circuit condition with the first conductive member, and the stand-by circuit drives the second conductive member to the first potential in response to indications from the storage circuit.

22. The circuit of claim 21, wherein:

the storage circuit includes at least one fuse.

23. The circuit of claim 19, including:

a plurality of second conductive members;

the stand-by circuit includes a plurality of driver circuits coupled to the second conductive members and the decoder circuit, the driver circuits driving the plurality of second conductive members to the first potential when activated, and when at least one of the second conductive members has the short circuit condition with the first conductive member; and the decoder circuit commonly activates the drivers in the stand-by state.

24. The circuit of claim 17, wherein:

the semiconductor device is random access memory;

the second conductive member is a word line; and the driver circuit is a word line driver circuit.

25. The circuit of claim 1, wherein:

the stand-by circuit isolates the second conductive member, allowing the short circuit condition to place the second conductive member generally at the first potential.

26. The circuit of claim 1, wherein:

the stand-by circuit includes an isolation device for creating a high impedance path between the second conductive member and other circuits within the semiconductor device.

27. The circuit of claim 26, wherein:

the isolating device creates a high impedance path by being disabled, and the isolating device is disabled by a decoder signal.

28. The circuit of claim 26, wherein:

the stand-by circuit includes a driver circuit for driving the second conductive member between a high signal potential and low signal potential, the isolation device being coupled between the driver circuit and the second conductive member.

29. The circuit of claim 28, wherein:

the second conductive member is a word line; and the driver circuit is a word line driver.

30. The circuit of claim 28, wherein:

the stand-by circuit includes a first device that couples the second conductive member to the high signal potential and a second device that couples the second conductive member to the low signal potential, both the first and second devices being turned off in the stand-by state.

31. The circuit of claim 28, wherein:

the second device is turned off by a decoder signal.

32. In a semiconductor device having a first conductor and a second conductor, and at least a first operating mode, the first conductor being charged to a first pre-determined voltage in the first mode, a method for reducing the current consumption of the semiconductor device in the first operating mode, comprising the steps of:

determining if a short circuit condition exists between the second conductor and the first conductor; and if a short circuit condition exists between the first conductor and the second conductor, adjusting the voltage of the second conductor to reduce the amount of current that is drawn between the first conductor and the second conductor through the short circuit.

33. The method of claim 32, wherein:

determining if a short circuit condition exists between the first conductor and the second conductor includes charging the second conductor to a second pre-determined voltage, and sensing if the second conductor approaches the first pre-determined voltage from the second pre-determined voltage.

34. The method of claim 32, wherein:

determining if a short circuit condition exists between the first conductor and the second conductor includes reading defect identifying information stored on the semiconductor device.

35. The method of claim 34, wherein:

reading defect identifying information includes sensing the status of at least one fuse.

36. The method of claim 34, wherein:

determining if a short circuit condition exists between the first conductor and the second conductor includes reading defect identifying information and generating a redundant enable signal.

37. The method of claim 32, wherein:

adjusting the voltage of the second conductor includes driving the second conductor to the first pre-determined voltage.

38. The method of claim 37, wherein:

driving the second conductor includes latching the second conductor at the first pre-determined voltage.

39. The method of claim 37, wherein:

driving the second conductor includes driving a word line to the first pre-determined voltage.

40. The method of claim 32, wherein:

adjusting the voltage of the second conductor includes isolating the second conductor from the remainder of the semiconductor device, and allowing current to flow between the first conductor and the second conductor such that the voltage of the second conductor approaches the first pre-determined voltage.

41. A random access memory that reduces defect induced stand-by current, comprising:

at least one first conductive line charged to a first reference voltage in a stand-by mode;

at least one second conductive line; and a sense circuit coupled to the second conductive line for indicating if the second conductive line varies from a second reference voltage due to a short condition between the second conductive layer and a first reference voltage.

42. The circuit for reducing stand-by current of claim 41, wherein:

the sense circuit includes a first driver having an input coupled to the second conductive line, the first driver generating a sense driver output signal in response to the second conductive line varying from the second reference voltage.

43. The circuit for reducing stand-by current of claim 41, including:

a second driver for driving the second conductive member to the second reference voltage in response to the sense circuit sensing a variance in voltage of the second conductive line.

44. The circuit for reducing stand-by current of claim 41, wherein:

the second driver is enabled in a stand-by mode and disabled in an active mode.

45. The circuit for reducing stand-by current of claim 44, wherein:

the second driver is a three-state driver that is placed in a high impedance state in the active mode.

46. The circuit for reducing stand-by current of claim 41, including:

a third driver for driving the second conductive member between a first active voltage and a second active voltage in an active mode, the third driver being disabled in the stand-by mode.

47. The circuit for reducing stand-by current of claim 46, including:

the third driver includes an input for receiving an input signal, a first active device for coupling the second conductive line to the first active voltage in the active mode and a second active device for coupling the second conductive line to the second active voltage in the active mode, the first and second active devices being disabled in the stand-by mode.

48. The circuit for reducing stand-by current of claim 46, including:

the third driver includes a third active device intermediate the second conductive line and the second active device, the second active device being disabled by the third active device being disabled.

49. The circuit for reducing stand-by current of claim 47, wherein:

the first active device is an insulated gate field effect transistor (IGFET) of a first conductivity type and the second active device is an IGFETs of a second conductivity type, the first and second IGFETs having gates coupled to the third driver input.

50. A random access memory, comprising:

a plurality of conductive lines;

a plurality of drivers, each driver associated with a respective conductive line, each driver coupling its respective conductive line to a first drive node when activated;

a first drive voltage supply coupled to the first drive node in an active mode;

a second drive voltage supply coupled to the first drive node in a stand-by mode; and a control circuit that activates at least one driver in the active mode, and that activates at least one selected driver in the stand-by mode if the conductive line associated with the at least one selected driver includes a short circuit condition.

51. The random access memory of claim 50, wherein:

the conductive lines are word lines.

52. The random access memory of claim 51, wherein:

the conductive lines are coupled to a plurality of memory cells that store information and are accessed by the application of a select voltage to the memory cells; and the first drive voltage supply is the select voltage.

53. The random access memory of claim 50, including:

a de-select voltage supply coupled to a de-select node;

the drivers couple their associated conductive lines to the de-select node when de-activated;

the control circuit de-activates at least one driver in the active mode.

54. The random access memory of claim 50, wherein:

the conductive lines are coupled to a plurality memory cells that store information, access to the memory cells being prevented by the application of the de-select voltage to the memory cells.

55. The random access memory of claim 50, including:

a de-select voltage supply coupled to a de-select node;

each driver couples its associated conductive line the de-select node when de-activated; and the control circuit de-activates at least one selected driver in the active mode if the conductive line associated with the at least one selected driver includes a short circuit condition.

56. The random access memory of claim 50, including:

at least one redundant conductive line;

a redundant driver associated with the at least one redundant conductive line, the redundant driver coupling the at least one redundant conductive line to the first drive node when activated;

a de-select voltage coupled to a de-select node;

each driver circuit couples its respective conductive line to the de-select node when de-activated; and the control circuit activates the redundant line driver and de-activates a selected driver if the conductive line associated with the selected driver includes a short circuit condition.

57. The random access memory of claim 50, including:

a de-select voltage coupled to a de-select node;

at least one redundant conductive line;

a redundant driver associated with the at least one redundant conductive line, the redundant driver coupling the at least one redundant conductive line to the de-select node when de-activated; and the control circuit de-activates the redundant line driver and activates at least one selected driver in the stand-by mode, if the conductive line associated with the selected driver includes a short circuit condition.

58. The random access memory of claim 50, wherein:

the control circuit includes a plurality of decoders coupled to the drivers, each decoder activating the drivers in response to different predetermined address information, and an address circuit for providing pre-determined address information for at least one selected decoder in the stand-by mode, if the selected decoder is coupled to a driver associated with a conductive line having a short circuit condition.

59. The random access memory of claim 58, wherein:

each decoder is coupled to a group of drivers and activates the group of drivers in response to different predetermined address information.

60. The random access memory of claim 58, wherein:

the address circuit provides address information to the decoders in the active mode.

61. The random access memory of claim 58, including:

a redundant conductive line;

a redundant driver associated with the redundant conductive line, the redundant driver coupling the redundant conductive line to the first drive node when activated, the control circuit includes the decoders de-activating the drivers in response to a redundant enable indication, and a redundant decoder coupled to the redundant driver for activating the redundant driver in response to a redundant enable indication.

62. A semiconductor device, comprising:

a plurality of conductive lines;

at least one node at a first voltage;

a conductive line;

a first device coupled between the conductive line and a first drive node, the first device providing a low impedance path between the first drive node and the conductive line when enabled, and providing a high impedance path between the first drive node and the conductive line when disabled;

a second device coupled between the conductive line and a second drive node, the second device providing a low impedance path between the second drive node and the conductive line when enabled, and providing a high impedance path between the second drive node and the conductive line when disabled;

a defect indication node; and a driver control circuit operatively coupled to the defect indication node, and at least the second device, for disabling at least the second device in response to a defect indication condition at the defect indication node, and allowing the conductive line to approach the first voltage in the event the conductive line is coupled to the first voltage.

63. The random access memory of claim 62, wherein:

the first device is an insulated gate field effect transistor (IGFET).

64. The random access memory of claim 62, wherein:

the second device is an insulated gate field effect transistor (IGFET).

65. The random access memory of claim 62, including:

a select node; and the driver control circuit is operatively coupled to the select node, and enables the first device and disables the second device in response to a select condition at the select node.

66. The random access memory of claim 62, including:

a select node; and the driver control circuit is operatively coupled to the select node, and disables the first device and enables the second device in response to a de-select condition at the select node.

67. In semiconductor device having a plurality of conductive lines and a short node at a short voltage, a line driver circuit for reducing current drawn by short circuit conditions in the semiconductor device, the line driver circuit comprising:

a conductive line;

a driver circuit for driving a driver output node to a first drive voltage;

a defect indication node; and an isolating device coupled to the conductive line and the driver circuit for introducing a high impedance path between the conductive line and the driver output node in response to a defect indication condition at the defect indication node, such that the conductive line will approach the short voltage by way of a short circuit condition in the event a short circuit condition exists between the conductive line and the short node.

68. The random access memory of claim 67, wherein:

the isolation device is an insulated gate field effect transistor (IGFET).

69. The random access memory of claim 67, including:

an input node; and the driver circuit is coupled to the input node and drives the driver output node to the first drive voltage in response to a select condition on the input node, and drives the driver output node to a second drive voltage in response to a de-select condition on the input node.

70. A line driver circuit, comprising:

a conductive line;

an active mode driver circuit having a disable mode coupled to the conductive line;

a sense circuit having an input coupled to the conductive line and an output; and a stand-by mode driver circuit having an input coupled to the output of the sense circuit and an output coupled to the conductive line.

71. The line driver circuit of claim 70, wherein:

the active mode driver circuit includes a first active mode driver transistor and a second active mode driver transistor, each active mode driver transistor having a pair of current passing terminals and a control terminal, the first and second active mode driver transistors having current passing terminals disposed in series between the conductive line and a first drive node, the control terminal of the first active mode transistor receiving a select signal, the control terminal of the second active mode driver transistor receiving a stand-by mode disable signal.

72. The line driver circuit of claim 71, wherein:

the first transistor has one if its current passing terminals coupled to the conductive line.

73. The line driver circuit of claim 71, wherein:

the second transistor has one if its current passing terminals coupled to the conductive line.

74. The line driver circuit of claim 70, wherein:

the sense circuit includes a first sense transistor and a second sense transistor, the sense transistors each having a control gate and a pair of current passing terminals, the current passing terminals of the first sense transistor being disposed between the conductive line and a stand-by voltage node and the current passing terminals of the second transistor being disposed between the conductive line and a reference voltage, the control terminals of the first and second transistors being coupled to the conductive line.

75. The line driver circuit of claim 70, wherein:

the stand-by mode driver circuit includes a first stand-by mode driver transistor and a second stand-by mode driver transistor, the stand-by mode driver transistors each having a pair of current passing terminals and a control terminal, the first and second standby mode driver transistors having current passing terminals disposed in series between the conductive line and a stand-by voltage node, the control terminal of the first stand-by mode transistor being coupled to the output of the sense circuit, the control terminal of the second active mode driver transistor receiving an active mode disable signal.

76. The line driver circuit of claim 75, wherein:

the stand-by mode driver circuit further includes a third stand-by mode driver transistor and a fourth stand-by mode driver transistor, each also having a pair of current passing terminals and a control terminal, the third and fourth standby mode driver transistors having current passing terminals disposed in series between the conductive line and a reference voltage node, the control terminal of the third stand-by mode transistor being coupled to the output of the sense circuit, the control terminal of the second active mode driver transistor receiving an active mode disable signal.

* * * * *